(12) United States Patent
Vaidyanath et al.

(10) Patent No.: US 8,762,657 B2
(45) Date of Patent: Jun. 24, 2014

(54) METHOD AND SYSTEM FOR SYNCHRONIZING ADDRESS AND CONTROL SIGNALS IN THREADED MEMORY MODULES

(75) Inventors: Arun Vaidyanath, San Jose, CA (US); Craig E. Hampel, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 215 days.

(21) Appl. No.: 13/384,585

(22) PCT Filed: Jul. 1, 2010

(86) PCT No.: PCT/US2010/040810
§ 371 (c)(1),
(2), (4) Date: Jan. 17, 2012

(87) PCT Pub. No.: WO2011/016934
PCT Pub. Date: Feb. 10, 2011

(65) Prior Publication Data
US 2012/0117338 A1   May 10, 2012

Related U.S. Application Data

(60) Provisional application No. 61/229,044, filed on Jul. 28, 2009.

(51) Int. Cl.
*G06F 12/00* (2006.01)
(52) U.S. Cl.
USPC ........................................................ 711/154
(58) Field of Classification Search
None
See application file for complete search history.

(56) References Cited

U.S. PATENT DOCUMENTS

| | | | |
|---|---|---|---|
| 7,062,601 B2 * | 6/2006 | Becca et al. | 711/108 |
| 7,289,383 B2 | 10/2007 | Cornelius | |
| 8,166,218 B2 * | 4/2012 | Rajamani | 710/71 |
| 2002/0026600 A1 | 2/2002 | Jung et al. | |
| 2003/0101296 A1 | 5/2003 | Kuzmenka | |
| 2005/0105318 A1 | 5/2005 | Funaba et al. | |

(Continued)

FOREIGN PATENT DOCUMENTS

WO   WO-2006-039608 A2   3/2006

OTHER PUBLICATIONS

EP Search Report re EP Application No. 10806800.8 filed Jul. 1, 2010, mail date of Aug. 13, 2013. 4 pages.

(Continued)

*Primary Examiner* — Brian Peugh

(57) ABSTRACT

A memory system includes a memory module which further includes a set of memory devices. The set of memory devices includes a first subset of memory devices and a second subset of memory devices. An address bus is disposed on the memory module, wherein the address bus includes a first segment coupled to the first subset and a second segment coupled to the second subset. An address signal traverses the set of memory devices in sequence. The memory system also includes a memory controller which is coupled to the memory module. The memory controller includes a first circuit to output a first control signal that controls the first subset, such that the first control signal and the address signal arrive at a memory device in the first subset at substantially the same time. The memory controller additionally includes a second circuit to output a second control signal that controls the second subset, such that the second control signal and the address signal arrive at a memory device in the second subset at substantially the same time.

30 Claims, 7 Drawing Sheets

(56) References Cited

U.S. PATENT DOCUMENTS

2007/0019494 A1   1/2007   Moosrainer et al.
2007/0127304 A1   6/2007   Yoon et al.
2011/0161576 A1*  6/2011   Kim et al. .................... 711/105

OTHER PUBLICATIONS

International Preliminary Report on Patentability (Chapter I) and Written Opinion mailed Feb. 9, 2012 re Int'l Application No. PCT/US10/040810. 5 pages.

* cited by examiner

METHOD AND SYSTEM FOR SYNCHRONIZING ADDRESS AND CONTROL SIGNALS IN THREADED MEMORY MODULES

TECHNICAL FIELD

The present embodiments generally relate to memory systems. Specific embodiments relate to methods and apparatus for synchronizing memory system address signal operation in example systems that use multiple per-thread control signals.

DETAILED DESCRIPTION

Figure 1:
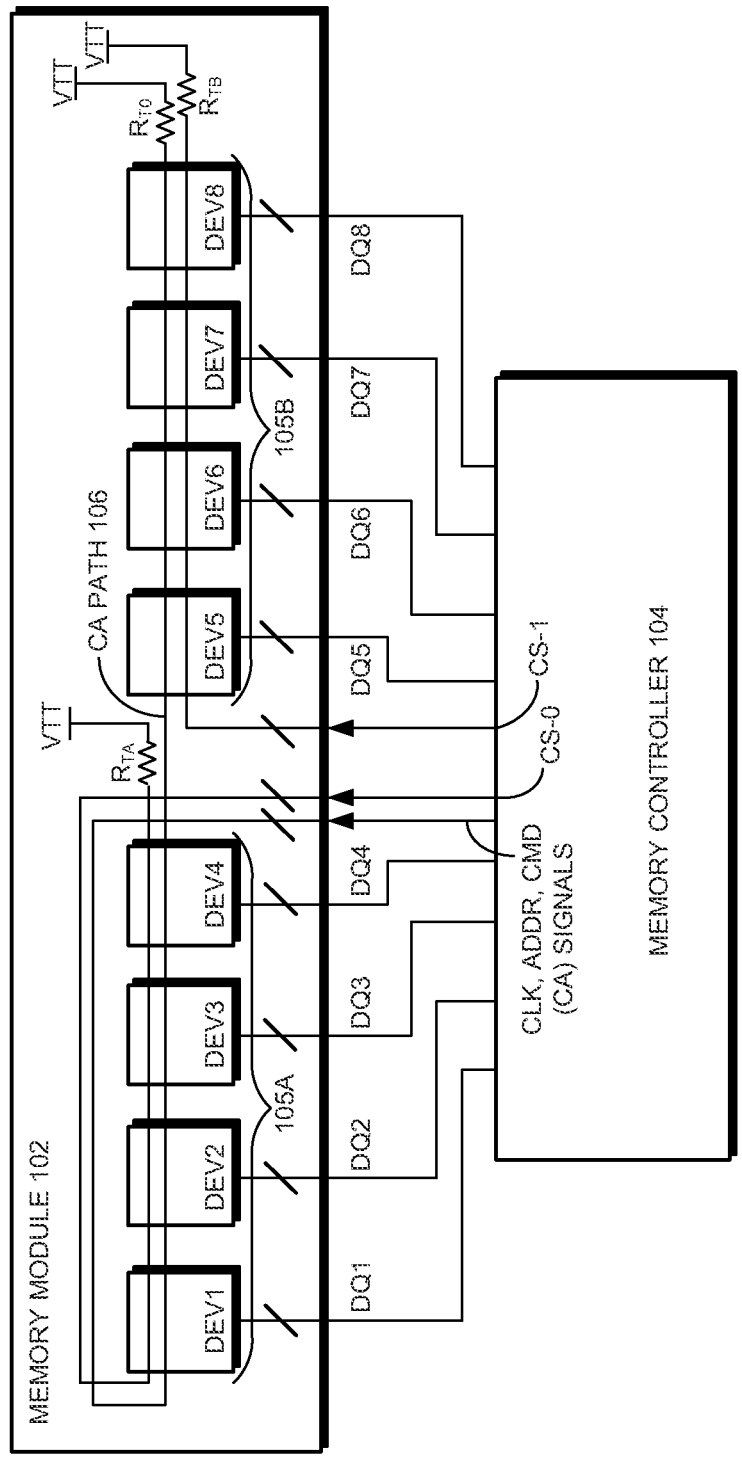
FIG. 1 presents a block diagram illustrating a memory system which supports both fly-by addressing and memory module threading.

The present description, in the example embodiments that follow, presents various techniques for a memory module which supports shared address signals in a fly-by addressing topology and multiple per-thread control signals.

Fly-by addressing in a memory system involves using source-synchronous techniques to transmit address, clock, and command signals to a set of memory devices such that these signals arrive at each memory device of the set in sequence. Moreover, memory module threading involves independently controlling subsets of memory devices disposed on the module to achieve independent memory device subset accesses.

In a fly-by addressing topology, the address, clock, and command signals are transmitted source-synchronously to a set of memory devices on a memory module. The clock signal propagates along with the address and command information, such that the signals arrive synchronously at the interface of each memory device. However, in this topology, the set of signals propagating on the shared signal paths arrives at different memory devices at slightly different times. Because the arrival times of the signals at the device interfaces are distributed in time, the time at which the signals encounter the input capacitance of each of the memory devices is similarly distributed, which can enhance signal integrity and enable higher data rates.

In some embodiments, the shared address signals and the per-thread control signals may be synchronized by matching associated signal path lengths while accounting for loading effects. In some embodiments, the shared address signals and per-thread control signals are synchronized by using a controller to independently calibrate the per-thread control signals to account for timing differences. In some embodiments, the shared address signals and per-thread control signals can be synchronized based on delay values stored in non-volatile memory located on the memory module. In other embodiments, each memory module may be selectively configured to be either a threaded or a non-threaded module at the time of assembly.

In some embodiments, module threading may be implemented in a set of memory devices on a memory module to optimize memory bandwidth utilization and power. For example, the set of memory devices may be divided into two or more subsets of devices, wherein each subset may be independently accessed using a per-thread control signal. Some control signals which can be configured as per-thread signals include, but are not limited to, chip select (CS) signals, clock-enable (CKE) signals, and on-die termination (ODT) signals.

In a memory module that supports both a fly-by addressing topology and module threading, some signals on the request bus (e.g., address, control, and/or clock signals) are routed to all devices associated with multiple threads, while per-thread control signals are routed to subsets of the devices associated with individual threads. This creates a challenge to synchronize the signals which are routed to all devices with the per-thread signals which are only routed to a subset of devices. In addition, the termination of the per-thread signals needs to be considered to ensure the proper signal integrity and timing.

FIG. 1 presents a block diagram illustrating a memory system 100 which supports fly-by addressing and memory module threading. More specifically, memory system 100 includes a memory module 102, which is coupled to a memory controller 104. Memory module 102 further includes a set of memory devices, DEV1 to DEV8. In the following discussion, a memory device is also referred to as a "device" and memory devices are also referred as "devices." Although eight devices are shown, other embodiments can have fewer or more devices. While the eight devices are illustrated in a linear configuration, the present technique is not limited to such a linear configuration. Each device is coupled to memory controller 104 through respective data paths DQ1 to DQ8. In one embodiment, each data path DQx comprises 8-bit wide data. Hence, the combined data path between memory module 102 and memory controller 104 is 64 bits wide.

Memory module 102 is also coupled to memory controller 104 through a command/address/clock signal (CA) path 106. As illustrated in FIG. 1, CA path 106 is routed through all of the devices in a fly-by addressing topology. More specifically, CA path 106 is routed through all of the devices sequentially from DEV1 to DEV8, and terminates at termination resistor $R_{TO}$. During a memory operation, clock signals, address signals, and command signals are source-synchronously transmitted through CA path 106, such that they all arrive at the interface of each device at substantially the same time with respect to the clock. Furthermore, the group of signals arrives at different devices at slightly different times; for example, the signals will arrive at DEV1 shortly before DEV2 and so on.

In the particular embodiment shown, the set of devices is further divided into two subsets: 105A, which includes DEV1 to DEV4, and 105B, which includes DEV5 to DEV8. Each of the subsets 105A and 105B is additionally coupled to memory controller 104 through a respective chip-select (CS) signal, CS-0 and CS-1. Specifically, CS-0 is routed from DEV1 to DEV4 and then terminates at resistor $R_{TA}$, and CS-1 is routed from DEV5 to DEV8 and terminates on resistor $R_{TB}$. Each of the CS signals independently controls the associated subset of devices, so that it can be enabled or disabled independently of the other subset. Hence, CS signals CS-0 and CS-1 are per-thread control signals, and memory module 102 is a threaded memory module.

In other embodiments the set of eight devices is partitioned into more than two subsets, and for each particular partition, the number of devices within one subset can be different from the number of devices within another subset. For example, the eight memory devices may be divided into three subsets, wherein the first subset includes three devices, the second subset includes three devices, and the third subset includes two devices. In another embodiment, the set of devices is divided into four subsets of two devices each. For each particular partition, each resulting subset of devices can then be coupled to a unique chip-select signal, thereby enabling the subset to be independently enabled. While the discussion below uses CS signals as the per-thread signals, the technique described below is generally applicable to other types of control signals, or groups of control signals, which include, but are not limited to, CKE and ODT signals.

In the embodiment of FIG. 1, the first per-thread chip-select signal CS-0 is routed through the subset of devices 105A in a manner which is synchronized with a first segment of CA path 106, which is also routed through devices 105A. In one embodiment, synchronizing between CS-0 and the first segment of CA path 106 involves matching the trace lengths and the associated loads on each accessed device. By synchronizing CS-0 with CA path 106, the CS-0 signal arrives at each device in subset 105A at substantially the same time as the associated address signals, clock signals, and command signals propagating over CA path 106. In fact, CS-0 may be routed identically to the routing of CA path 106; however, CS-0 terminates after passing through DEV4.

As illustrated in FIG. 1, the second per-thread chip-select signal CS-1 is routed from memory controller 104 directly to DEV5 and then sequentially through subset 105B. Thus, if CS-1 is launched from memory controller 104 at the same time as the associated address signals, the address signals and CS-1 will not arrive at subset 105B at the same time, regardless of whether timing-matching has been achieved on subset 105A. Instead, the address signals will generally arrive some time after CS-1 has arrived due to the additional propagation delays associated with the first segment of CA path 106. This timing difference becomes increasingly significant as data rates increase. Hence, it is necessary to synchronize CS-1 with the address signals on the second segment of CA path 106, which is routed through subset of devices 105B.

In the discussion below, different synchronization techniques are described. Note that while these synchronization techniques are described in the context of the two chip-select signals illustrated in memory system 100, these techniques can also be used to synchronize any number of per-thread control signals with the associated address signals in a fly-by addressing topology.

Physical Trace Length Matching

In the following discussion, it is assumed that CS-0 has been aligned with the associated address signals on the first segment of CA path 106. In the particular embodiment illustrated in FIG. 1, this alignment is obtained when the sum of all printed circuit board (PCB) trace lengths leading to subset 105A in the address path substantially equals the sum of all trace lengths leading to subset 105A along the signal path of CS-0. While trace length differences account for the majority of the delay difference, impedance differences between CS-0 and the address signals on each device should also be considered. In one embodiment, timing differences caused by impedance loading for each device may be converted into trace length equivalents for delay compensation on that device. In this way, CS-0 and the address signals will arrive at each memory device in subset 105A at substantially the same time. This general concept of trace-length matching is also applied to aligning CS-1 with the address signals below.

Figure 2:
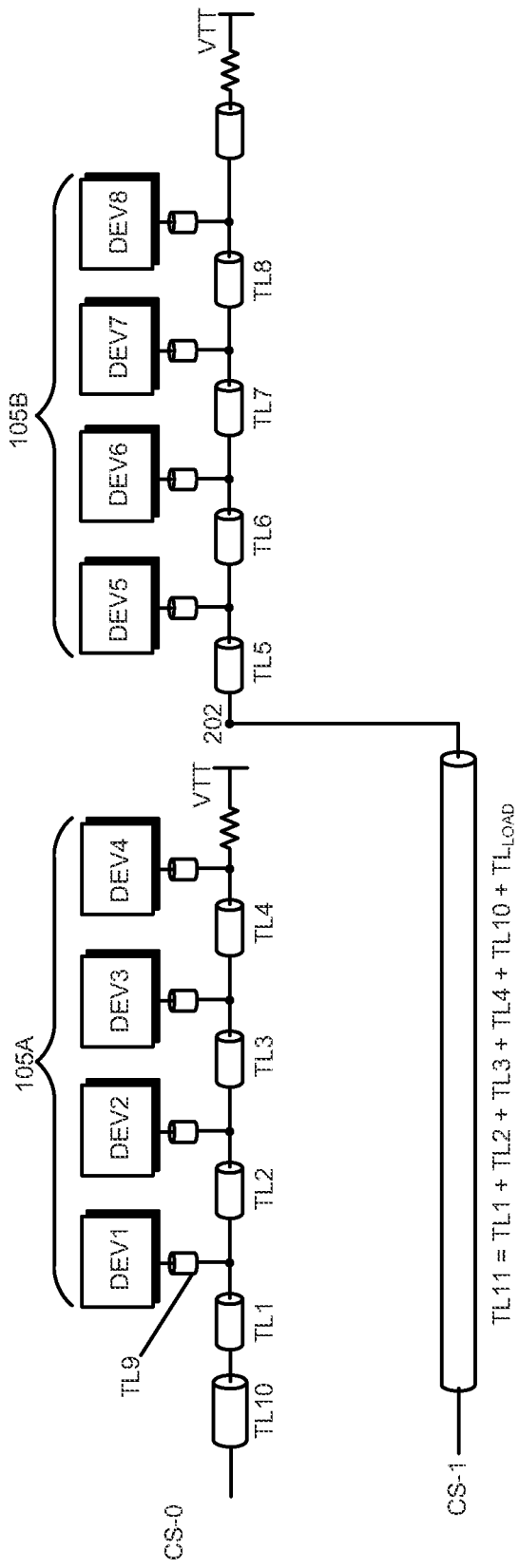
FIG. 2 presents a routing delay model for memory module to illustrate a physical trace-length matching technique for aligning the address signals with per-thread chip-select signals.

FIG. 2 presents a routing delay model of memory module 102 to illustrate a physical trace-length matching technique for timing-aligning the second chip-select signal CS-1 with the address signals. To timing-match CS-1 with the address signals on the second segment of CA path 106, the timing-mismatch (hereinafter referred to as a "delay delta") between CS-1 and the address signals is first determined. However, because CS-0 is already aligned with the address signals, the delay delta between CS-0 and CS-1 can be determined as a substitute for determining the delta delay between CS-1 and the address signals. As illustrated in FIG. 2, a CS signal path routed through the set of devices DEV1 to DEV8 may be modeled with distributed trace-length delays associated with the devices. In particular, the CS-0 signal path routed through subset 105A is associated with trace-length delays TL1 to TL4, respectively. Note that these trace-length delays are in series along the CS-0 signal path, and are therefore additive. Similarly, the CS-1 signal path routed through subset 105B is associated with trace-length delays TL5 to TL8, respectively.

In addition, each device can have an impedance loading effect on the signal lines, causing an additional loading delay. This loading delay is modeled in FIG. 2 as a delay element coupled between each device and CA path 106, such as TL9 associated with DEV1. Also coupled in series with the trace-lengths delays TL1 to TL4 is a trace-length delay TL10, which represents a lumped trace-length delay which aggregates other trace-length delays in the CS-0 signal path from the source (on memory controller 104) to the first subset 105A.

Hence, from the source to the input of the second subset of devices 105B, the address signals have a combined delay of TL11=(TL1+TL2+TL3+TL4+TL10+$TL_{LOAD}$), wherein the delay term $TL_{LOAD}$ includes the loading effect of the devices 105A, and the other terms correspond to the above-described trace-length delays. Consequently, to make CS-1 and the associated address signals arrive at the input of the second subset of devices 105B at substantially the same time, CS-1 can be routed through a corresponding trace length having a delay of TL11, as is illustrated in FIG. 2. Note that in this embodiment the control signals CS-0 and CS-1 and the address signals may be launched from memory controller 104 and arrive at the module at substantially the same time.

The above-described physical trace-length matching may be implemented entirely on the memory module (i.e., by disposing the matching delay trace entirely on the memory module) without requiring additional control pins on either the memory module or the memory controller. In the embodiment shown in FIG. 2, after matching the trace length, CS-1 and the address signals arrive at the second subset of devices 105B, and subsequently at each device in 105B, at substantially the same time. In addition to synchronizing CS signals, the physical trace-length matching technique can also be applied to synchronize CKE signals, ODT signals, and other control signals.

Controller-Based Delay Delta Calibration

In one embodiment, aligning the delay delta between the address signals and the CS signals in FIG. 1 involves using memory controller 104 to calibrate the delay delta between these two types of signals. Furthermore, each CS signal can be independently calibrated and aligned with the address signals by memory controller 104.

Figure 3A:
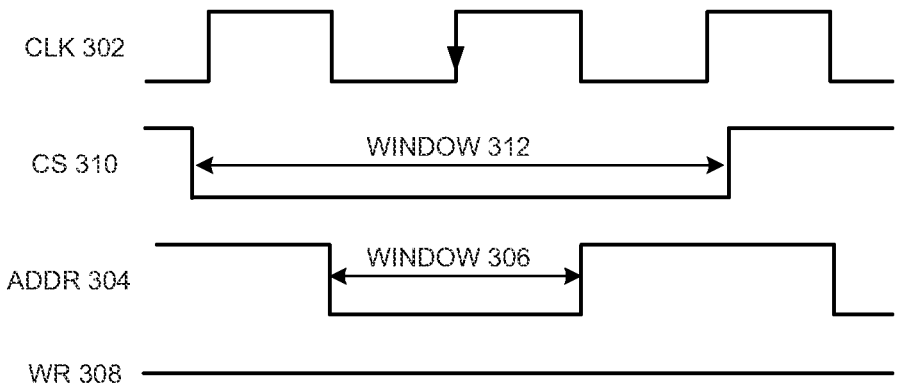
FIG. 3A presents timing diagrams illustrating the process of writing a memory device with an extended chip select window and a one-clock-cycle address window.
Figure 3B:
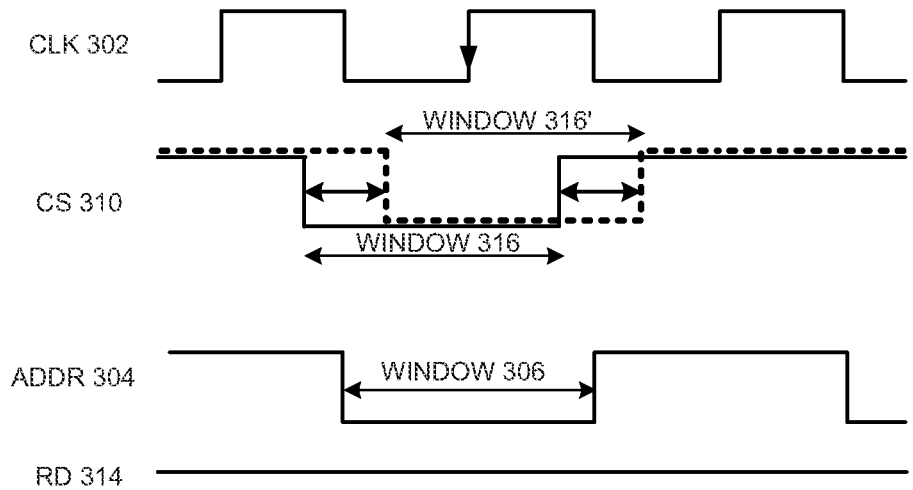
FIG. 3B presents timing diagrams illustrating the process of phase-aligning the chip select window with the address valid window.

FIGS. 3A and 3B present timing diagrams for an embodiment in which delay deltas are calibrated between a per-thread CS signal and the address signals. More specifically, FIG. 3A presents a timing diagram that illustrates a process of writing a memory device (such as DEV1) with an extended CS enable window and a one-clock-cycle address window. As shown in FIG. 3A, clock signal (CLK) 302 is already phase-aligned with address signal (ADDR) 304 as they are transmitted together in the fly-by addressing topology. Note that a valid write window 306 of ADDR 304 is one clock cycle long, wherein the triggering edge of CLK 302 is centered within window 306. Furthermore, CLK 302 and ADDR 304 are accompanied by a write command WR 308, illustrated as a constant voltage level. To ensure a successful write within write window 306, a chip-select signal CS 310 can have an extended enable window 312 such that the entire write window 306 is enveloped within the extended enable window 312. Using such a long CS window mitigates the delay delta between the CS signal and address signals.

FIG. 3B presents timing diagrams illustrating an embodiment which performs a calibration operation to phase-align CS enable window 316 with address valid window 306 by reading back the written data from the memory device. As illustrated in FIG. 3B, CLK 302 and ADDR 304 are now accompanied by a read command 314. Moreover, a moving CS enable window 316 is used to calibrate the phase relationship between CS 310, ADDR 304 and the reference clock. In one embodiment, CS enable window 312 is configured to be approximately one clock cycle long.

In one embodiment, memory controller 104 programs a range of phase delays to CS 310 so that CS window 316 is moved around valid window 306. For example, in FIG. 3B the dashed CS window 316 can represent the original position of CS window 316 without the programmed delay. The solid CS window 316 can represent the position of phase-shifted CS window 316 with the largest programmed delay. For each position of CS window 316 between these two boundary positions, memory controller 104 then attempts to read back data which are previously written to the memory device. In this way, memory controller 104 can determine both the left and right boundary positions (not shown) of calibration window 316 which define a window for reliably reading from the memory device. Next, memory controller 104 can determine the center of this window, which should be relatively close to the center of window 306. Based on the difference between the center position of original CS window 316 and the determined center position of calibrated CS window 316, memory controller 104 determines a delay delta between CS 310 and ADDR 304. Finally, memory controller 104 can delay the launch of CS 310 by the delay delta, so that CS 310 arrives at each device in subset 105B at substantially the same time as CLK 302 and ADDR 304. Note that in general there are many techniques for calibrating the center position of the CS signal to align it with the address signals, and these techniques do not necessarily have to use a single cycle length CS calibration window.

The above-described controller-based calibration technique can be repeated independently for each group of memory devices controlled by a per-thread control signal. For example, in the embodiment of FIG. 1, the controller-based calibration technique can first be performed to align CS-0 with the address signals, and then to align CS-1 with the address signals. However, if CS-0 and the address signals are already trace-length matched as indicated in FIG. 1, then only CS-1 needs to be calibrated. In one embodiment, this controller-based calibration technique is performed during a system booting process to determine the delay deltas.

In addition to synchronizing CS signals, the controller-based delay delta calibration technique can also be applied to synchronize CKE signals, ODT signals, and other control signals.

Controller-Based De-Skew Based on Pre-Computed Delay Deltas

In one embodiment, aligning the delay delta between the address signals and the CS signals in FIG. 1 involves using memory controller 104 to directly delay the CS signals based on delay deltas stored in a non-volatile memory device that is included on memory module 102. Furthermore, each per-thread CS signal can be independently delayed at the controller.

Figure 4:
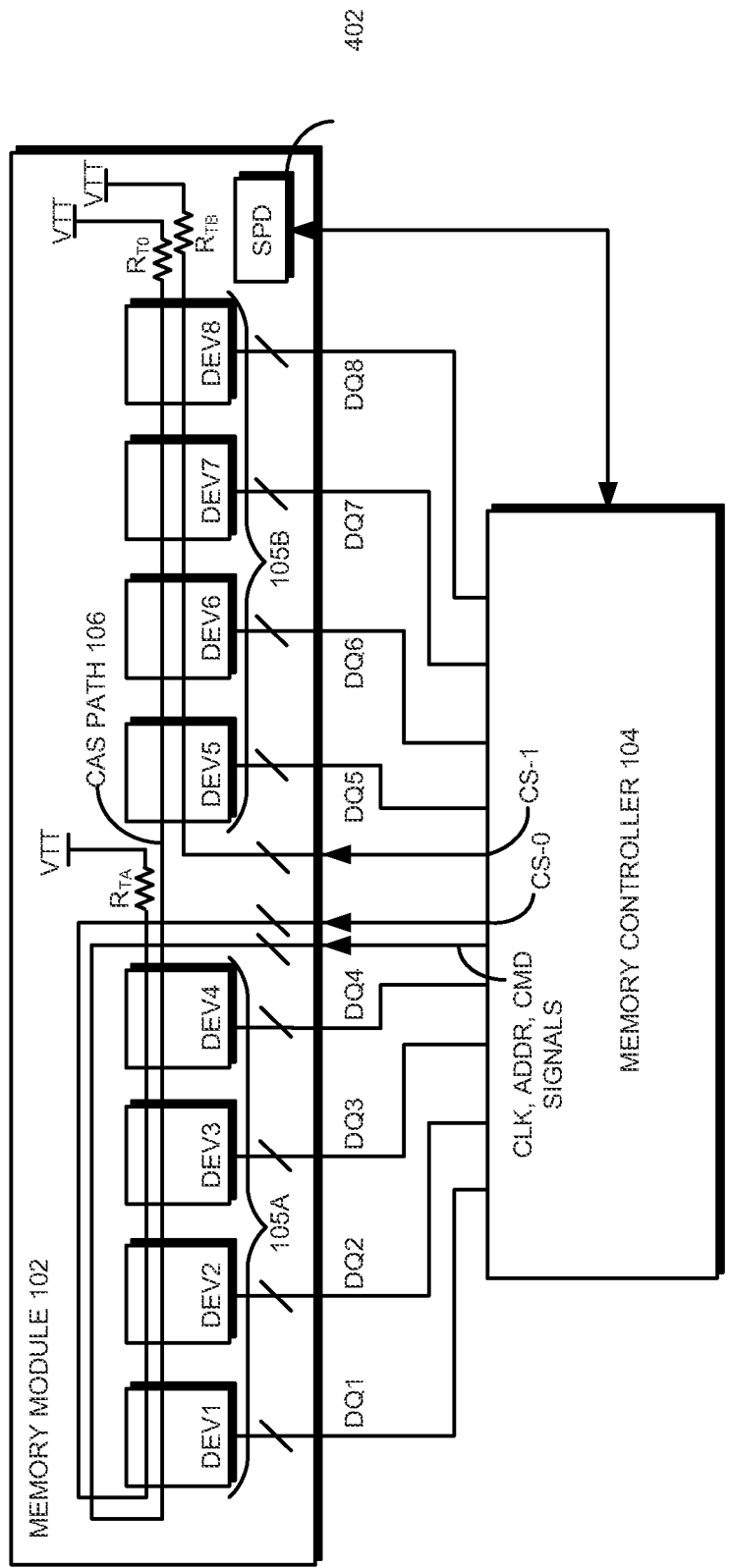
FIG. 4 illustrates a modified memory system with an SPD memory device which is used to store delay values.

In one embodiment, a manufacturer-provided or pre-computed delay delta can be programmed into a serial presence detect (SPD) memory device (e.g., a serial port non-volatile flash memory device) located on memory module 102. The pre-computed delay delta is stored in the SPD device (the delay delta associated with particular control signal information) at the time of manufacturing of the memory module. FIG. 4 illustrates an embodiment of memory system 100 in FIG. 1 wherein pre-computed delay deltas are stored in an SPD memory device 402 located on memory module 102. In this embodiment, memory controller 104 can individually delay each per-thread control signal based on the corresponding delay value from SPD memory device 402. More specifically, during a boot-up sequence, memory controller 104 can read the stored delay deltas associated with CS signal information from SPD memory device 402. Memory controller 104 then determines individual delay times in which to launch per-thread CS signals, to compensate for the timing-skew between the address signals and the CS signals during normal operation. For example, in the embodiment illustrated in FIG. 4, because the address signals and the first per-thread control signal CS-0 are already trace-length matched, memory controller 104 only delay the second per-thread control signal CS-1, so that CS-1 arrives at each device in subset 105B at substantially the same time as the associated address signals.

Figure 5:
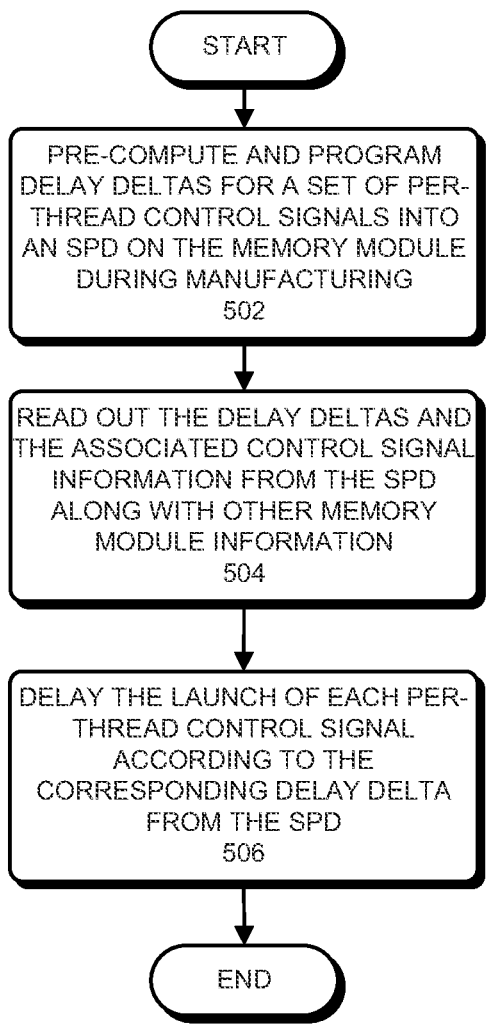
FIG. 5 presents a flowchart illustrating a process for synchronizing a per-thread control signal with a fly-by address signal in accordance with a present technique.

FIG. 5 presents a flowchart illustrating a process for synchronizing a per-thread control signal and a fly-by address signal. At the time of manufacturing, delay deltas are determined (for example, by the manufacturer of the memory module) for a set of per-thread control signals. These delay deltas are then programmed into an SPD memory device on the memory module (step 502).

During the system start-up process, the delay deltas in the SPD memory device and the associated control signal information can be read out along with other memory module information by the memory controller or initialization program, such as a BIOS (step 504). Hence, at the end of the system start-up process, the timing offsets for the set of per-thread control signals are set in the memory controller based on the corresponding delay deltas extracted from the SPD memory device. Next, during normal operation, the memory controller delays the launch of each per-thread control signal according to the timing offsets programmed by the memory controller, thereby aligning the fly-by address signals with the per-thread control signals (step 506).

While the above technique is described in the context of using the SPD memory device, other types of non-volatile storage devices on the memory module can be used to store and retrieve the delay deltas. Furthermore, in certain embedded system design, the delay deltas can also be micro-coded into the memory controller itself if the embedded system design uses a common memory controller that support systems having different memory configurations. Specifically, a different set of timing skews may be micro-coded into the controller for each of the configurations. While the above technique describes de-skewing CS signals, the de-skewing technique based on the programmed delay deltas can also be applied to de-skew CKE signals, ODT signals, and other control signals.

Configuring for Standard or Threaded Access Mode

Figure 6:
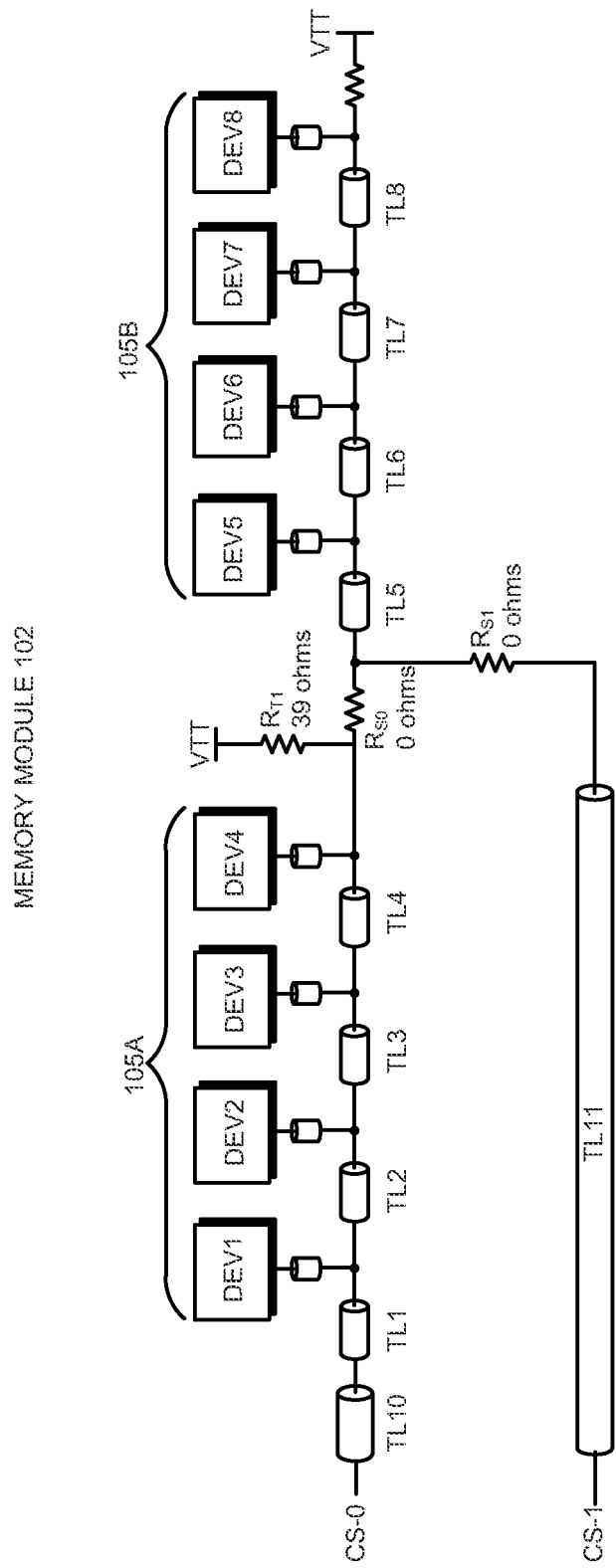
FIG. 6 illustrates an embodiment of a memory module which can be selectively configured as a standard non-threaded module or a multi-threaded module.

In various embodiments, circuits are placed on memory module 102 to allow the manufacturer to configure the module as either a single-threaded module or a multi-threaded module. More specifically, FIG. 6 illustrates an embodiment of memory module 102 which can be selectively configured as a standard non-threaded module or a multi-threaded module. As illustrated in FIG. 6, memory module 102 can include up to three transistor-based resistors, $R_{T1}$, $R_{S0}$, and $R_{S1}$, where $R_{T1}$ has a resistance suitable for terminating a control signal, while both $R_{S0}$ and $R_{S1}$ have substantially zero resistance. Each of these resistors can be optionally mounted or not mounted during assembly at the manufacturer.

More specifically, in order to configure memory module 102 as a multi-threaded module, the system connects $R_{S1}$ to allow CS-1 to reach and independently control the second subset of memory devices 105B. Meanwhile, the system does not connect $R_{S0}$ so that CS-0 cannot reach devices 105B. The system additionally connects $R_{T1}$ to terminate the CS-0 without causing reflection at the end of the signal path. This configuration allows CS-0 and CS-1 to independently control the respective subsets of devices 105A and 105B.

Alternatively, in order to configure memory module 102 as a standard single-threaded module, the system connects $R_{S0}$ so that CS-0 can reach all memory devices on module 102. However, the system does not connect $R_{T1}$ because no termination is needed at the end of the first subset of devices 105A. The system also does not connect $R_{S1}$ so that CS-1 is blocked from reaching the second subset of devices 105B. Note that the above-described circuit facilitates configuring memory module 102 either as a standard single-thread module or a dual-threaded module. This technique can be extended to allow configuring a memory module to have three, four, or other numbers of threads by duplicating the described circuit.

Above-described techniques and apparatus can be used in different systems employing different types of memory devices. Such system can be, but is not limited to, a mobile system, desktop computer, server, and/or a graphics application. The memory devices can include dynamic random access memory (DRAM). Moreover, the DRAM may be, e.g., graphics double data rate (GDDR, GDDR2, GDDR3, GDDR4, GDDR5, and future generations) and double data rate (DDR2, DDR3 and future memory types).

The techniques and apparatus described may be applicable to other types of memory, for example, flash and other types of non-volatile memory and static random access memory (SRAM). Moreover, throughout this description, a clock signal is described; it should be understood that a clock signal in the context of the instant description may be embodied as a strobe signal or other signal that conveys a timing reference and is not limited to a signal that is strictly periodic. For example, the clock signal may be a strobe signal that is aperiodic in the sense that transitions only occur when data is being transmitted. In the general context, the clock signal may be any type of signal that conveys timing information (e.g., temporal information that indicates that data is valid).

Figure 7:
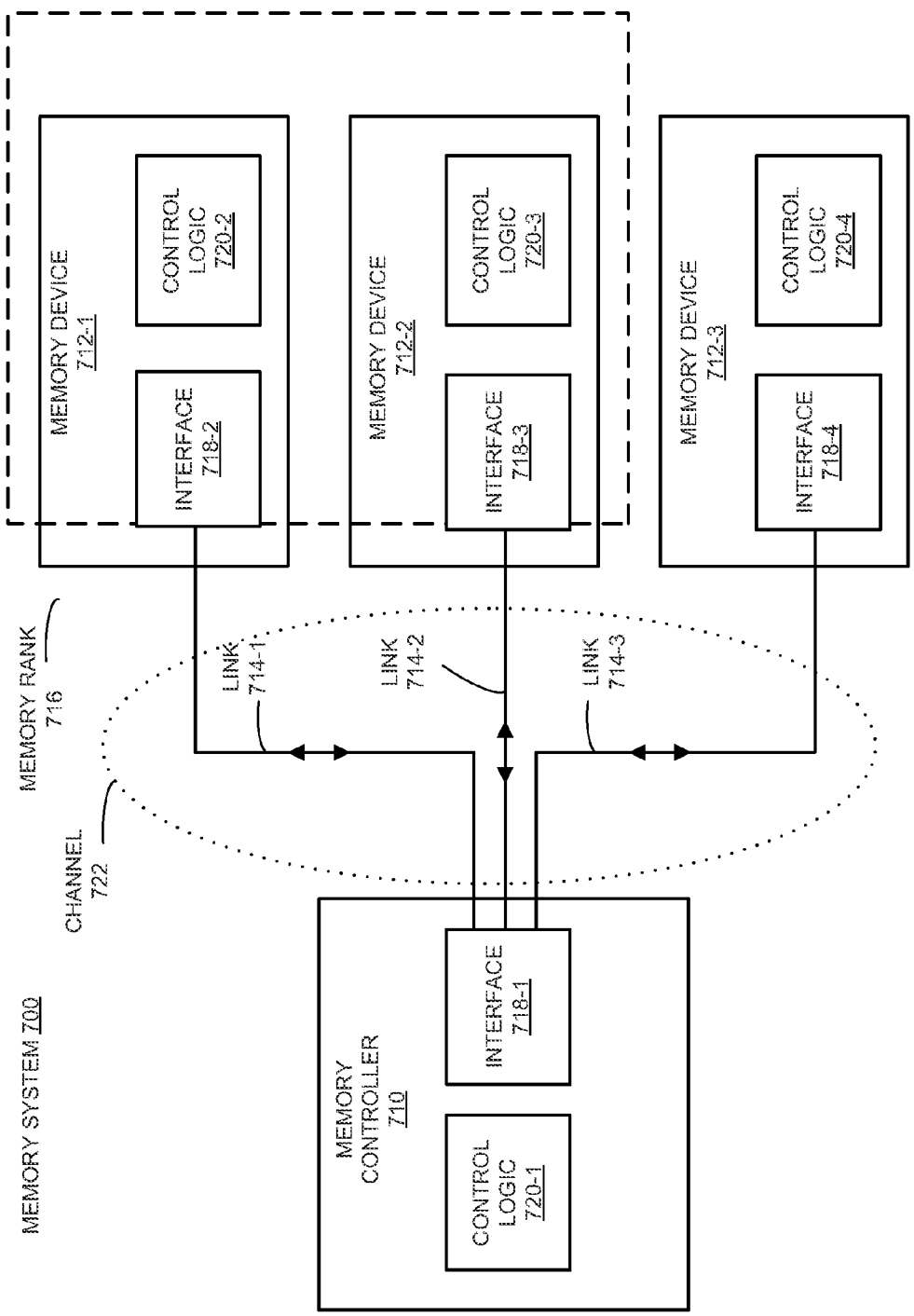
FIG. 7 presents a block diagram illustrating an embodiment of a memory system, which includes at least one memory controller and one or more memory devices.

Additional embodiments of memory systems that may use one or more of the above-described apparatus and techniques are described below with reference to FIG. 7. FIG. 7 presents a block diagram illustrating an embodiment of a memory system 700, which includes at least one memory controller 710 and one or more memory devices 712. While FIG. 7 illustrates memory system 700 with one memory controller 710 and three memory devices 712, other embodiments may have additional memory controllers and fewer or more memory devices 712. Moreover, while memory system 700 illustrates memory controller 710 coupled to multiple memory devices 712, in other embodiments two or more memory controllers may be coupled to each other. Note that memory controller 710 and one or more of the memory devices 712 may be implemented on the same or different integrated circuits, and that the one or more integrated circuits may be included in a chip-package.

In some embodiments, the memory controller 710 is a local memory controller (such as a DRAM memory controller) and/or is a system memory controller (which may be implemented in a microprocessor).

Memory controller 710 may include an I/O interface 718-1 and control logic 720-1. As discussed in FIGS. 3A-3B, control logic 720-1 may be used to calibrate the delay deltas between the fly-by address signals and the multiple per-thread control signals. Control logic 720-1 may include circuits (e.g., registers) to store information representative of the delay deltas.

In some embodiments, one or more of memory devices 712 include control logic 720 and at least one of interfaces 718. However, in some embodiments some of the memory devices 712 may not have control logic 720. Moreover, memory controller 710 and/or one or more of memory devices 712 may include more than one of the interfaces 718, and these interfaces may share one or more control logic 720 circuits. In some embodiments two or more of the memory devices 712, such as memory devices 712-1 and 712-2, may be configured as a memory rank 716.

Memory controller 710 and memory devices 712 are coupled by one or more links 714, such as multiple wires, in a channel 722. While memory system 700 is illustrated as having three links 714, other embodiments may have fewer or more links 714. Moreover, these links may provide: wired, wireless and/or optical communication. Furthermore, links 714 may be used for bi-directional and/or unidirectional communication between the memory controller 710 and one or more of the memory devices 712. For example, bi-directional communication between the memory controller 710 and a given memory device may be simultaneous (full-duplex communication). Alternatively, the memory controller 710 may transmit information (such as a data packet which includes a command) to the given memory device, and the given memory device may subsequently provide requested data to the memory controller 710, e.g., a communication direction on one or more of the links 714 may alternate (half-duplex communication). Also, one or more of the links 714 and corresponding transmit circuits and/or receive circuits may be dynamically configured, for example, by one of the control logic 720 circuits, for bi-directional and/or unidirectional communication.

Signals corresponding to data and/or commands (such as request-for-data commands) may be communicated on one or more of the links 714 using either or both edges in one or more timing signals. These timing signals may be generated based on one or more clock signals, which may be generated onchip (for example, using a phase-locked loop and one or more reference signals provided by a frequency reference) and/or off-chip. In some embodiments, operations involved in transmitting and receiving these signals may be synchronous and/or asynchronous.

In some embodiments, commands are communicated from the memory controller 710 to one or more of the memory devices 712 using a separate command link, i.e., using a subset of the links 714 which communicate commands. However, in some embodiments commands are communicated using the same portion of the channel 722 (i.e., the same links 714) as data. Moreover, communication of commands: may have a lower data rate than the data rates associated with communication of data between the memory controller 710 and one or more of the memory devices 712; may use different carrier frequencies than are used to communicate data; and/or may use a different modulation technique than is used to communicate data.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

In summary, this disclosure has described example techniques of operation in a memory system that includes a set of memory devices. During operation, the system synchronizes a first control signal, which controls a first subset of the memory devices, with an address signal propagating on a first segment of an address bus, wherein the first segment is coupled to the first subset of memory devices. Consequently, the first control signal and the address signal arrive at a memory device in the first subset of memory devices at substantially the same time. The address signal, after traversing the first segment of the address bus, traverses a second segment of the address bus, which is coupled to a second subset of the memory devices, and arrives at the second subset of memory devices in sequence. Next, the system routes a second control signal, which controls the second subset of memory devices, through a physical delay mechanism such that the second control signal and the address signal, propagating on the second segment of the address bus, arrive at a memory device in the second subset of memory devices at substantially the same time.

In some embodiments, the first and the second control signals are the same type of control signal, and these two signals control the respective first and second subsets of memory devices.

In some embodiments, the first control signal propagates on the first control line until reaching a termination coupled to an end of the first control line, and the second control signal propagates on the second control line until reaching a second termination coupled to an end of the second control line.

In some embodiments, the system synchronizes the first control signal with the first segment of the address bus by routing the first control signal such that the first control signal is trace-length matched with the first segment of the address bus on each device in the first subset of memory devices.

In some embodiments, the first and second control signals are one of chip-select (CS) signals, clock enable (CKE) signals, and on-die termination (ODT) signals.

In some embodiments, the system synchronizes the second control signal with the second segment of the address bus by routing the second control signal through a physical delay mechanism to delay the second control signal.

In some embodiments, the physical delay mechanism is a printed circuit board (PCB) trace having a PCB trace delay that substantially matches a propagation delay of the first and second segment of the address bus.

In some embodiments, the system routes the second control signal with the second segment of the address bus by calibrating the second control signal to de-skew a phase offset between the second control signal and the address signal.

In some embodiments, the system calibrates the second control signal by first writing data to a memory device in the second subset of memory devices. The system then positions a valid window of the second control signal in the vicinity of a valid address window associated with the memory device. Next, the system reads from the memory device while adjusting the valid window of the second control signal relative to the valid address window associated with the memory device. The system subsequently determines a position of the valid window relative to the valid address window which corresponds to a successful read-out of the written data. Finally, the system fixes a position of the second control signal relative to the address signals based on the position of the valid window relative to the valid address window.

In some embodiments, the system writes the data to the memory device by enveloping a valid address window associated with the memory device with an extended valid window of the second control signal.

In some embodiments, the valid address window spans one clock cycle.

In some embodiments, the address signal is source-synchronized with a clock signal propagating along a signal trace included in the address bus.

In some embodiments, the system synchronizes the second control signal with the second segment of the address bus by delaying the second control signal based at least on a pre-computed delay value.

In some embodiments, the system retrieves the pre-computed delay value from a non-volatile storage during a system booting process.

In some embodiments, the non-volatile storage is a serial presence detect (SPD) memory device located on a memory module.

In some embodiments, the memory module can be selectively configured to be either a single-threaded module or a multi-threaded module during an assembly process. More specifically, in the single-threaded module configuration, the first control signal is additionally routed to the second subset of the memory devices. Alternatively, in the multi-threaded module configuration, the first control signal is terminated at the exit of the first subset of the memory devices.

In some embodiments, the memory module further includes a first resistor which has substantially zero-ohm resistance, a second resistor which has substantially zero-ohm resistance, and a terminating resistor. When configuring the memory module to be either a single-threaded module or a multi-threaded module, one or more of the first, second, and terminating resistors can be selectively connected during the assembly process.

This disclosure has described a memory module. This memory module includes a set of memory devices, which further includes a first subset of memory devices and a second subset of memory devices. An address bus is disposed on the memory module, wherein the address bus includes a first segment coupled to the first subset of memory devices and a second segment coupled to the second subset of memory devices. An address signal traverses the first segment and arrives at each memory device of the first subset of memory devices in sequence, wherein the address signal, after traversing the first segment, traverses the second segment and arrives at each memory device in the second subset of the memory devices in sequence. The memory module can receive multiple control signals, wherein each control signal controls a subset of the memory devices. The memory module further includes a first control signal line coupled to the first subset of memory devices, wherein the first control signal line is routed such that a propagation delay of a first control signal propagating on the first control signal line is substantially the same as a propagation delay of the address signal propagating on the first segment. The memory module additionally includes a second control signal line coupled to the second subset of memory devices, wherein the second control signal line is routed such that a propagation delay of a second control signal propagating on the second control signal line is substantially the same as a propagation delay of the address signal propagating on the second segment.

In some embodiments, the second control signal line includes a printed circuit board (PCB) trace to cause a PCB trace delay.

This disclosure has described a memory system. This memory system includes a memory module which further includes a set of memory devices, and the set of memory devices includes a first subset of memory devices and a second subset of memory devices. An address bus is disposed on the memory module, wherein the address bus includes a first segment coupled to the first subset of memory devices and a second segment coupled to the second subset of memory devices. An address signal traverses the first segment and arrives at the first subset of memory devices in sequence, wherein the address signal, after traversing the first segment, traverses the second segment and arrives at the second subset of the memory devices in sequence. The memory system also includes a memory controller which is coupled to the memory module. The memory controller further includes a first circuit to output a first control signal that controls the first subset of memory devices, wherein the first control signal is output such that the first control signal and the address signal arrive at a memory device in the first subset of memory devices at substantially the same time. The memory controller additionally includes a second circuit to output a second control signal that controls the second subset of memory devices, wherein the second control signal is output such that the second control signal and the address signal arrive at a memory device in the second subset of memory devices at substantially the same time.

In some embodiments, the memory controller also includes a third circuit to calibrate the second control signal to de-skew a phase offset between the second control signal and the address signal.

In some embodiments, the second circuit includes a delay mechanism to delay the output of the second control signal based at least on a pre-computed delay value stored in a storage location on the memory module.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method of operation in a memory system that includes a set of memory devices, the method comprising:
synchronizing a first control signal, which controls a first subset of the memory devices, with an address signal propagating on a first segment of an address bus, wherein the first segment is coupled to the first subset of memory devices, such that the first control signal and the address signal arrive at a memory device in the first subset of memory devices at substantially the same time;
wherein the address signal, after traversing the first segment of the address bus, traverses a second segment of the address bus, which is coupled to a second subset of the memory devices, and arrives at the second subset of memory devices in sequence; and routing a second control signal, which controls the second subset of memory devices, through a physical delay mechanism such that the second control signal and the address signal, propagating on the second segment of the address bus, arrive at a memory device in the second subset of memory devices at substantially the same time.

2. The method of claim 1, wherein the physical delay mechanism is a printed circuit board (PCB) trace having a PCB trace delay that substantially matches a propagation delay of the first and second segment of the address bus.

3. The method of claim 1, wherein synchronizing the first control signal with the first segment of the address bus involves routing the first control signal such that the first control signal is trace-length matched with the first segment of the address bus on each memory device in the first subset of memory devices.

4. The method of claim 1, wherein the first and second control signals are one of: chip-select (CS) signals; clock enable (CKE) signals; and on-die termination (ODT) signals.

5. A memory module comprising:
a set of memory devices including a first subset of memory devices and a second subset of memory devices;
an address bus including a first segment coupled to the first subset of memory devices and a second segment coupled to the second subset of memory devices, wherein an address signal traverses the first segment and arrives at the each memory device in the first subset of memory devices in sequence, wherein the address signal, after traversing the first segment, traverses the second segment and arrives at each memory device in the second subset of the memory devices in sequence;
a first control signal line coupled to the first subset of memory devices, wherein the first control signal line is routed such that a propagation delay of a first control signal propagating on the first control signal line is substantially the same as a propagation delay of the address signal propagating on the first segment; and
a second control signal line coupled to the second subset of memory devices, wherein the second control signal line is routed such that a propagation delay of a second control signal propagating on the second control signal line is substantially the same as a propagation delay of the address signal propagating on the second segment.

6. The memory module of claim 5, wherein the first and the second control signals are the same type of control signal; and wherein the first and the second control signals control the respective first and second subsets of memory devices.

7. The memory module of claim 5, wherein the first control signal propagates on the first control line until reaching a termination coupled to an end of the first control line; and wherein the second control signal propagates on the second control line until reaching a second termination coupled to an end of the second control line.

8. The memory module of claim 5, wherein the first control signal line is trace-length matched with the first segment of the address bus coupled to each memory device in the first subset of memory devices.

9. The memory module of claim 5, wherein the first and second control signals are one of: chip-select (CS) signals; clock enable (CKE) signals; and on-die termination (ODT) signals.

10. The memory module of claim 5, wherein the memory module is selectively configured to be either a single-threaded module or a multi-threaded module during an assembly process; wherein in the single-threaded module configuration, the first control signal is additionally routed to the second subset of memory devices; and wherein in the multi-threaded module configuration, the first control signal is terminated at the exit of the first subset of memory devices.

11. The memory module of claim 10, wherein the memory module further comprises: a first resistor which has substantially zero-ohm resistance; a second resistor which has substantially zero-ohm resistance; and a terminating resistor; wherein configuring the memory module to be either a single-threaded module or a multi-threaded module involves selectively connecting one or more of the first, second, and terminating resistors during the assembly process.

12. A method of operation in a memory system that includes a set of memory devices, the method comprising:
synchronizing a first control signal, which controls a first subset of the memory devices, with an address signal propagating on a first segment of an address bus, such that the first control signal and the address signal arrive at a memory device in the first subset of memory devices at substantially the same time;
wherein the address signal, after traversing the first segment of the address bus, traverses a second segment of the address bus, which is coupled to a second subset of the memory devices, and arrives at each memory device in the second subset of memory devices in sequence; and
calibrating a second control signal to de-skew a phase offset between the second control signal and the address signal such that the second control signal and the address signal arrive at a memory device in the second subset of memory devices at substantially the same time.

13. The method of claim 12, wherein calibrating the second control signal involves:
writing data to a memory device in the second subset of memory devices;
positioning a valid window of the second control signal in the vicinity of a valid address window associated with the memory device;
reading from the memory device while adjusting the valid window of the second control signal relative to the valid address window associated with the memory device;
determining a position of the valid window relative to the valid address window which corresponds to a successful read-out of the written data; and
fixing a position of the second control signal relative to the address signal based on the position of the valid window relative to the valid address window.

14. The method of claim 13, wherein writing the data to the memory device involves enveloping a valid address window associated with the memory device with an extended valid window of the second control signal.

15. The method of claim 13, wherein the valid address window spans one clock cycle.

16. The method of claim 12, wherein the address signal is source-synchronized with a clock signal propagating along a signal trace included in the address bus.

17. The method of claim 12, wherein the first and second control signals are one of: chip-select (CS) signals; clock enable (CKE) signals; and on-die termination (ODT) signals.

18. A memory system comprising:
a memory module including a set of memory devices, the set of memory devices including a first subset of memory devices and a second subset of memory devices;
an address bus disposed on the memory module, wherein the address bus includes a first segment coupled to the first subset of memory devices and a second segment coupled to the second subset of memory devices, wherein an address signal traverses the first segment and arrives at each memory device of the first subset of memory devices in sequence, wherein the address signal, after traversing the first segment, traverses the second segment and arrives at each memory device of the second subset of the memory devices in sequence;
a memory controller coupled to the memory module, the memory controller including: a first circuit to output a first control signal that controls the first subset of memory devices, wherein the first control signal is output such that the first control signal and the address signal arrive at a memory device in the first subset of memory devices at substantially the same time; and a second circuit to output a second control signal that controls the second subset of memory devices, wherein the second control signal is output such that the second control signal and the address signal arrive at a memory device in the second subset of memory devices at substantially the same time.

19. The memory system of claim 18, wherein the memory controller further includes a calibration mechanism to calibrate the second control signal to de-skew a phase offset between the second control signal and the address signal.

20. The memory system of claim 19, wherein the calibration mechanism is configured to:
write data into a memory device in the second subset of the memory devices;
position a valid window of the second control signal in the vicinity of a valid address window associated with the memory device;
read from the memory device while adjusting the valid window of the second control signal relative to the valid address window associated with the memory device;
determine a position of the valid window relative to the valid address window which corresponds to successful read-out of the written data; and
fix a position of the second control signal relative to the address signals based on the position of the valid window relative to the valid address window.

21. The memory system of claim 20, wherein while writing the data into the memory device, the calibration mechanism is further configured to envelope a valid address window associated with the memory device with an extended valid window of the second control signal.

22. The memory system of claim 20, wherein the valid address window is one clock cycle window.

23. The memory system of claim 20, wherein the non-volatile storage is a serial presence detect (SPD) memory device located on the memory module.

24. The memory system of claim 19, wherein the memory controller retrieves the delay value from a non-volatile storage during a system booting process.

25. The memory system of claim 18, wherein the second circuit includes a delay mechanism to delay the output of the second control signal based at least on a delay value stored in a storage location on the memory module.

26. The memory system of claim 18, wherein the address signal is source-synchronized with a clock signal propagating across the address bus.

27. The memory system of claim 18, wherein the first and second control signals are one of: chip-select (CS) signals; clock enable (CKE) signals; and on-die termination (ODT) signals.

28. The memory system of claim 18, wherein the memory module is selectively configured to be either a single-threaded module or a multi-threaded module during an assembly process; wherein in the single-threaded module configuration, the first control signal is additionally routed to the second subset of memory devices, while the second control signal is blocked from reaching the second subset of memory devices; and wherein in the multi-threaded module configuration, the first control signal is terminated at the exit of the first subset of memory devices, while the second control signal is routed to the second subset of memory devices.

29. The memory system of claim 28, wherein the memory module further comprises: a first resistor which has substantially zero-ohm resistance; a second resistor which has substantially zero-ohm resistance; and a terminating resistor; wherein configuring the memory module into either a single-threaded module or a multi-threaded module involves selectively connecting one or more of the first, second and terminating resistors during the assembly process.

30. A memory controller comprising:
a first circuit to output an address signal onto an address bus, wherein the address bus includes a first segment coupled to a first set of memory devices and a second segment coupled to the second set of memory devices, wherein the address signal traverses the first segment and arrives at each memory device of the first set of memory devices in sequence, wherein the address signal, after traversing the first segment, traverses the second segment and arrives at each memory device of the second set of the memory devices in sequence;
a second circuit to output a first control signal that controls the first set of memory devices, wherein the first control signal is output such that the first control signal and the address signal arrive at a memory device in the first set of memory devices at substantially the same time; and
a third circuit to output a second control signal that controls the second set of memory devices, wherein the second control signal is output such that the second control signal and the address signal arrive at a memory device in the second set of memory devices at substantially the same time.

* * * * *